United States Patent
Stivers et al.

(10) Patent No.: US 6,506,526 B2
(45) Date of Patent: Jan. 14, 2003

(54) METHOD AND APPARATUS FOR A REFLECTIVE MASK THAT IS INSPECTED AT A FIRST WAVELENGTH AND EXPOSED DURING SEMICONDUCTOR MANUFACTURING AT A SECOND WAVELENGTH

(75) Inventors: Alan R. Stivers, San Jose, CA (US); Edita Tejnil, San Carlos, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/899,881

(22) Filed: Jul. 5, 2001

(65) Prior Publication Data

US 2001/0051304 A1 Dec. 13, 2001

Related U.S. Application Data

(62) Division of application No. 09/474,857, filed on Dec. 30, 1999, now Pat. No. 6,410,193.

(51) Int. Cl.⁷ .................................................. G03F 9/00
(52) U.S. Cl. ........................................................... 430/5
(58) Field of Search .............................. 430/5, 322, 324; 378/35; 250/492.21; 204/192.34, 192.32

(56) References Cited

U.S. PATENT DOCUMENTS 5,501,925 A * 3/1996 Smith et al. ..................... 430/5
6,042,995 A * 3/2000 White ............................. 430/5
6,319,635 B1 * 11/2001 Mirkarimi et al. ............. 430/5

* cited by examiner

*Primary Examiner*—S. Rosasco
(74) *Attorney, Agent, or Firm*—Blakely, Sokoloff, Taylor & Zafman LLP (57) ABSTRACT

A refelective mask having non-reflective and reflective regions. The reflective regions are reflective of light at an inspection wavelength and a semiconductor processing wavelength and the non-reflective regions are substantially non-reflective of light at the inspection wavelength and the semiconductor processing wavelength. The contrast of reflected light off of the non-reflective and reflective regions is greater than 0.210 at either of the two wavelengths.

28 Claims, 6 Drawing Sheets

METHOD AND APPARATUS FOR A REFLECTIVE MASK THAT IS INSPECTED AT A FIRST WAVELENGTH AND EXPOSED DURING SEMICONDUCTOR MANUFACTURING AT A SECOND WAVELENGTH

This application is a divisional application of, and claims the benefit of, an earlier filed U.S. Patent Application filed on Dec. 30, 1999 and provided U.S. patent application Ser. No. 09/474,857 now U.S. Pat. No. 6,410,193.

FIELD OF THE INVENTION

The field of invention relates to semiconductor lithography in general and mask manufacturing techniques that allow for DUV based inspection of EUV reflective masks more specifically.

BACKGROUND

Masks are used in semiconductor processing to properly form regions of light that are subsequently directed onto a semiconductor substrate. Depending on the type of resist (e.g., positive or negative) that is coated upon the substrate, the regions of light formed by the mask correspond to either the specific structures formed on the surface of the semiconductor substrate (e.g., gate electrodes, source/drain electrodes, vias and interconnect lines, among others) or the spaces between these structures.

Masks are patterned in a manner that corresponds to the structures formed on the substrate. A mask essentially affects the optical path between an exposure light source and the semiconductor substrate. The patterns on the mask prevent various portions of the exposure light from reaching the semiconductor substrate. As such, the mask is patterned with opaque as well as non-opaque regions.

The opaque regions prevent exposure light from reaching the semiconductor substrate. The non-opaque regions allow exposure light to reach the semiconductor substrate. The specific patterning of the mask's non-opaque regions corresponds to the shape of those regions of light that are subsequently directed onto the semiconductor substrate. Typically, each layer in a semiconductor device has its own corresponding mask that is used to form the specific structures at each layer according to the semiconductor device's particular design.

Figure 1A:
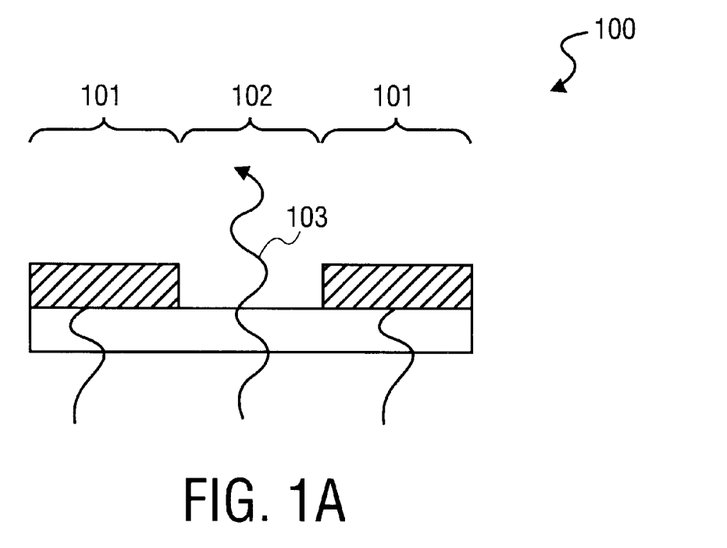
FIG. 1a shows a transmission mask.

Traditionally, transmission masks have been used for Deep Ultra Violet (DUV) lithography associated with semiconductor processing. Transmission masks are essentially inserted into the optical path between the exposure light source and the semiconductor substrate. A transmission mask 100 is shown in FIG. 1a. With transmission masks, the opaque regions 101 absorb and/or reflect exposure light while the non-opaque regions 102 are transparent to the exposure light. The light 103 passing through the non-opaque regions 102 is then directed to the semiconductor substrate surface.

Figure 1B:
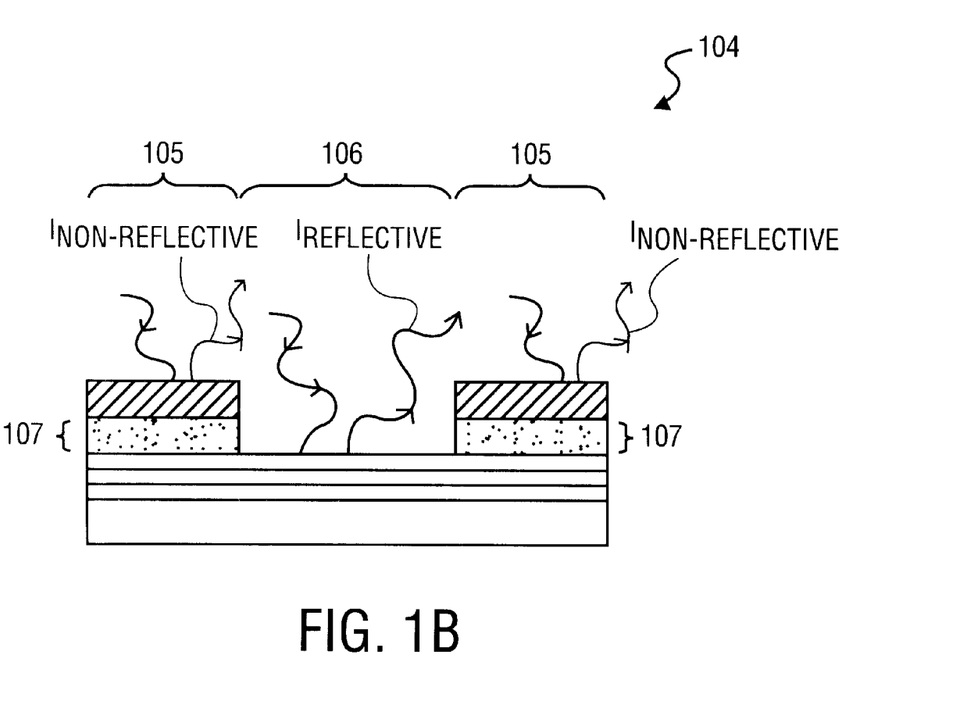
FIG. 1b shows a reflective mask.

As smaller and smaller device sizes are continually being formed within the semiconductor industry, the wavelength of the exposure light source continues to be reduced. As Extreme Ultra Violet (EUV) technology emerges, reflection rather than transmission masks are being developed. Reflection masks are positioned along the optical path between the exposure light source and the semiconductor substrate. A reflection mask 104 is shown in FIG. 1b. With reflection masks, the opaque regions 105 absorb exposure light while the non-opaque regions 106 reflect exposure light. Thus, for reflective masks, non-opaque regions correspond to reflective regions and opaque regions correspond to non-reflective regions. The light $I_{reflective}$ reflecting off of the reflective regions 106 is then directed to the semiconductor surface.

During the mask manufacturing process, defects in the mask patterning are searched for, found and corrected. Defects may be searched for at multiple instances during the mask manufacturing process. For example, before and after a buffer layer 107 (of FIG. 1b) is etched. A problem with the manufacturing of masks for EUV applications is that the tools used for the searching of patterning defects may not operate within the EUV spectrum (which, for purposes of this application, corresponds to light at wavelengths within 10–100 nm) but rather, the DUV spectrum (which, for purposes of this application, corresponds to light at wavelengths within 100–300 nm).

Since the mask is designed to affect EUV light, the optical properties of the non-reflective and reflective regions in the EUV spectra may be dissimilar from their optical properties in the DUV spectra. This may result in difficulties when searching for defects. Principally, if the mask does not exhibit a suitable difference between the reflected intensity of inspection tool light at the reflective regions and the non-reflective regions, the defect search tool will have difficulty recognizing the mask patterning and any defects therein.

SUMMARY OF INVENTION

A reflective mask having non-reflective and reflective regions. The reflective regions are reflective of light at an inspection wavelength and a semiconductor processing wavelength and the non-reflective regions are substantially non-reflective of light at the inspection wavelength and the semiconductor processing wavelength. The contrast of reflected light off of the non-reflective and reflective regions is greater than 0.210 at either of the two wavelengths.

BRIEF DESCRIPTION OF THE DRAWINGS

The present invention is illustrated by way of example, and not limitation, in the Figures of the accompanying drawings in which.

DETAILED DESCRIPTION

A reflective mask is described having non-reflective and reflective regions. The reflective regions are reflective of light at an inspection wavelength and a semiconductor processing wavelength and the non-reflective regions are substantially non-reflective of light at the inspection wavelength and the semiconductor processing wavelength. The contrast of reflected light off of the non-reflective and reflective regions is greater than 0.210 at either of the two wavelengths.

These and other embodiments of the present invention may be realized in accordance with the following teachings and it should be evident that various modifications and changes may be made in the following teachings without departing from the broader spirit and scope of the invention. The specification and drawings are, accordingly, to be regarded in an illustrative rather than restrictive sense and the invention measured only in terms of the claims.

In environments where the operational wavelength spectrum of a defect inspection tool used during the mask manufacturing process has little or no overlap with the operational wavelength spectrum of the exposure light source employed during the semiconductor device manufacturing process, the mask may be designed to operate in both the inspection and the exposure spectra.

For example, in various embodiments, the mask operates at an EUV wavelength during exposure within a semiconductor manufacturing environment while the defect inspection tool (used within the mask manufacturing process) operates at a DUV wavelength. An approach is to design a mask that is "operable" at both EUV and DUV wavelengths.

An operable reflective mask exhibits a difference in the intensity of the exposure light reflected from the reflective mask regions and the intensity of the exposure light reflected by the non-reflective regions that is detectable for inspection purposes and suitable for manufacturing exposure purposes. Note that the non-reflective region 105 does not necessarily absorb all of the incident exposure light. Thus, since some light intensity may also reflect off of the non-reflective region 105, the above described difference may also be referred to as the contrast exhibited in the image reflected from the mask.

Referring to FIG. 1b, the contrast is usually expressed as the difference between the intensity of the light reflected off of the non-reflective region, $I_{non-reflective}$, and the intensity of the light reflected off of the reflective region, $I_{reflective}$, represented as percentage of the reflected light from the reflective and non-reflective regions. That is, as provided in equation 1:

$$\text{Contrast} = (I_{reflective} - I_{non-reflective})/(I_{reflective} + I_{non-reflective}) \quad \text{Eqn. 1}$$

In order to be operable (i.e., "exposable") for EUV based semiconductor manufacturing, the mask's associated contrast in the EUV spectra should be sufficient to properly expose the photoresist that is coated upon the semiconductor wafer. For typical resists, such as UV6, an acceptable contrast range is typically any contrast greater than 0.750 as provided by Equation 1 above.

In order to be operable (i.e., "inspectable") for DUV based defect inspection tools, the mask's associated contrast at the DUV spectra should be sufficient for the exposure tool to recognize the patterns formed on the mask. For typical defect inspection tools, such as a KLA-Tencor 353UV, KLA-Tencor 365UVHR, Lasertec 9MD84SR, or Applied Materials ARIS-I an acceptable contrast range is typically any contrast range greater than 0.210 as provided by Equation 1 above. In the following discussion, various embodiments are discussed that are capable of exhibiting contrast ranges much greater than 0.210. However, those of ordinary skill will be able to create from the following teachings other embodiments having contrasts as low as 0.210.

It is important to note that the resists, inspection tools and ranges listed above are just examples. Resists or inspection tools, other than those listed above, may introduce corresponding contrast ranges different from those just described. However, those of ordinary skill will be able to take the teachings herein and successfully modify the embodiments discussed below accordingly.

Figure 2A:
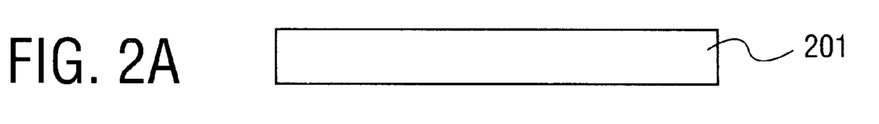
FIGS. 2a through 2g show a reflective mask processing sequence.
Figure 2B:
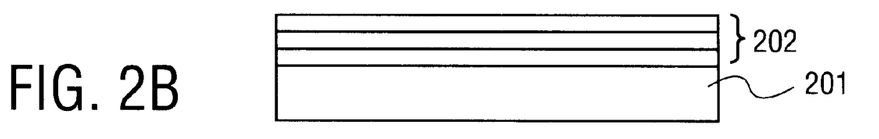

Furthermore, recall from the background that defects in the mask's patterning may be searched for at multiple instances during the mask manufacturing process. For example, FIGS. 2a through 2g show a process flow for the manufacture of an EUV mask that may be used according to the teachings herein. First, as shown in FIG. 2b, a multilayer structure 202 is formed upon a substrate 201. The substrate material may be, among other materials, silicon, fused silica or ultra low expansion (ULE) glass.

The multilayer structure 202 is designed to reflect EUV light and, as discussed in more detail below, corresponds to a reflective mask region. The multilayer structure 202, due to the materials and thickness used at each layer, creates a series of constructively interfering waves formed by the reflection of EUV exposure light at each layer in the multilayer structure 202.

A typical multilayer structure 202 may be implemented with 40 pairs of alternating layers of Molybdenum (Mo) and Silicon (Si) having approximate thickness of 2.7 Å and 4.0 Å, respectively. Such a Mo/Si multilayer structure typically has a peak reflection of about 65% at a wavelength of 13.4 nm. However, the exact thickness of the layers and the number of layer pairs may be varied by those of ordinary skill to tune the wavelength at which the EUV reflectivity is the highest and the range of the wavelengths where the multilayer is reflective.

Also, other layering structures, such as Mo/Be or MoRu/Be among others may be used as well. The multilayer structure 202 is formed by the execution of a plurality of layering steps, generally known in the art, and are not shown in FIG. 2 for simplicity. Furthermore, the specific thickness of each layer suitable for EUV reflection may also be readily determined by those of ordinary skill. Currently, most multilayer structures 202 have reflectivity within the DUV spectrum between 50 and 70%.

Figure 2C:
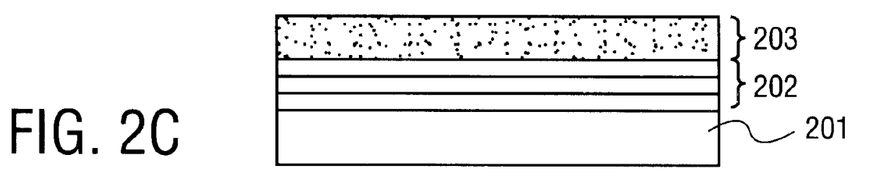

As shown in FIG. 2c, after the formation of multilayer structure 202, buffer layer 203 is formed over the multilayer structure 202. Buffer layer 203 is typically an oxide, such as $SiO_2$. Buffer layer 203 protects multilayer structure 202 during absorber layer 204 etch and corrective re-work of defects found in the masks patterning. The thickness of the buffer layer 203, as discussed in more detail below, may be used to adjust the contrast of the reflected image off of the mask. Other buffer layer materials that may be used include SiON.

Figure 2D:
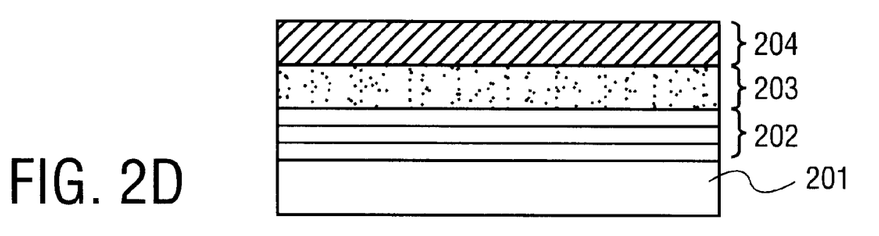

An absorber layer 204 is then formed over buffer layer 203 as shown in FIG. 2d. Absorber layer 204 is used to absorb semiconductor manufacturing exposure light. Prior art techniques typically employ Aluminum (Al) as an absorber material. However, as discussed in more detail ahead, other materials such as Titanium (Ti), Titanium Nitride (TiN), Chrome (Cr) and Nickel Silicide (NiSi) may be used to enhance the inspection contrast associated with the mask. The thickness used for the absorber layer 204 should be sufficient to absorb enough of the EUV exposure light. After a resist is applied to absorber layer 204 and then patterned with a radiation source (e.g., a light source or an e-beam source). Openings in the resist layer 206 are then created after a resist develop step, exposing the underlying absorber layer 204.

Figure 2E:
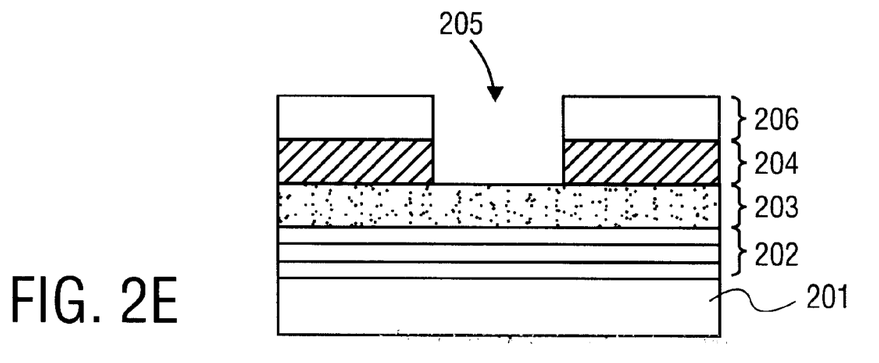
Figure 2F:
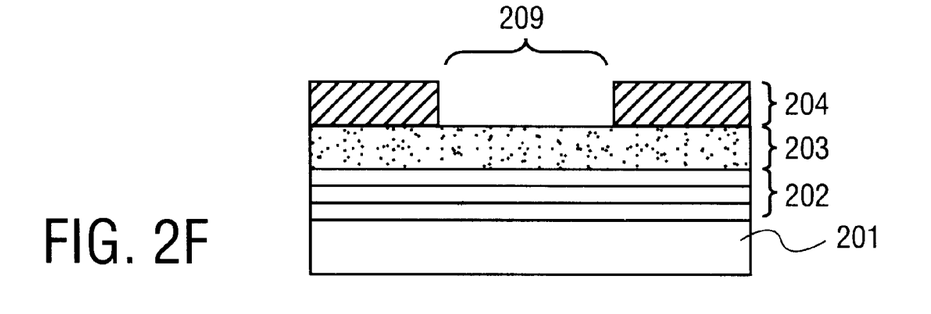

Then absorber layer 204 material is removed (e.g., by a plasma etch) from the openings 205 in the resist layer 206, as shown in FIG. 2e, which exposes the underlying buffer layer 203. The resist layer 206 is then removed as shown in FIG. 2f. Buffer layer 203 is then removed (e.g., by a dry oxide etch or a combination of dry and wet oxide etch) resulting in a completed mask structure, shown in FIG. 2g. Mask regions 207 having an absorber layer 204 correspond to the mask's non-reflective regions while mask regions 208 exposing the multilayer structure 202 correspond to the mask's reflective regions.

As mentioned above, the defect inspection process may take place at more than one process step within the mask manufacturing sequence shown in FIGS. 2a–g. For example, in various embodiments, the mask is observed with an inspection tool for patterning defects after the absorber layer 204 is etched and the resist 206 is removed (i.e., after the mask structure shown in FIG. 2f is formed). Any defects are corrected for with the buffer layer 203 acting as a protective layer for the multilayer structure 202. Then, as a final "go/no-go" test, the mask's patterning quality is again observed with an inspection tool after the manufacturing process is completed (i.e., at the mask structure in FIG. 2g).

Figure 2G:
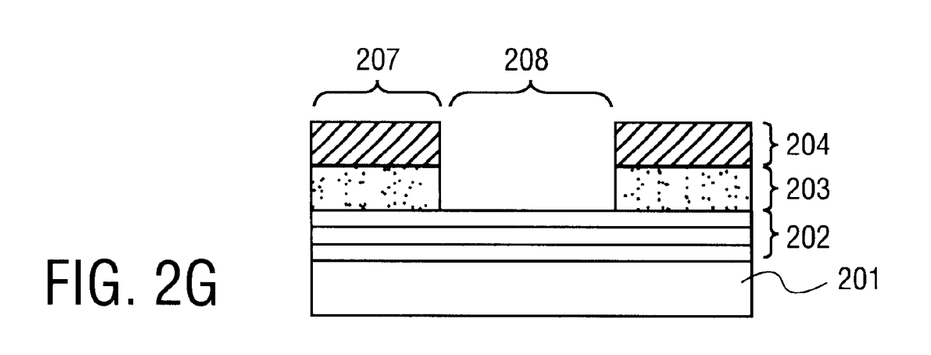

Thus, the structure shown in FIG. 2f should exhibit suitable contrast for DUV light while the structure shown in FIG. 2g should exhibit suitable contrast for EUV and DUV light. Various approaches may be undertaken to create a reflective mask that may be used for exposure within the EUV spectrum and inspection within the DUV spectrum. In one approach, the material(s) used to form the absorber layer 204 intrinsically absorb light but do not substantially reflect light in both spectra. In another approach, an anti-reflective coating (ARC) that cancels reflected light within the DUV spectrum is formed as part of the absorber layer 204 structure.

In embodiments directed to an absorber layer 204 having material(s) that intrinsically absorb and do not substantially reflect in both the EUV and DUV spectra, the focus is typically on materials that absorb and do not substantially reflect at the DUV spectra. That is, most conducting materials tend to intrinsically absorb EUV light but are reflective of DUV light. Optical properties of various materials may be found in published references such as: 1) Handbook of Optical Constants of Solids, vol. I, 185, and vol. II, 1991, edited by E. D. Palik, (Academic Press, Inc. 1991); and 2) J. H. Wever and H. P. R. Frederikse, Optical properties of metals and semiconductors, CRC Handbook of Chemistry and Physics, $66^{th}$ edition, edited by R. C. Weast, M. J. Astle, and W. H. Beyer, (CRC Press, Boca Raton, Fla., 1985).

Figure 3:
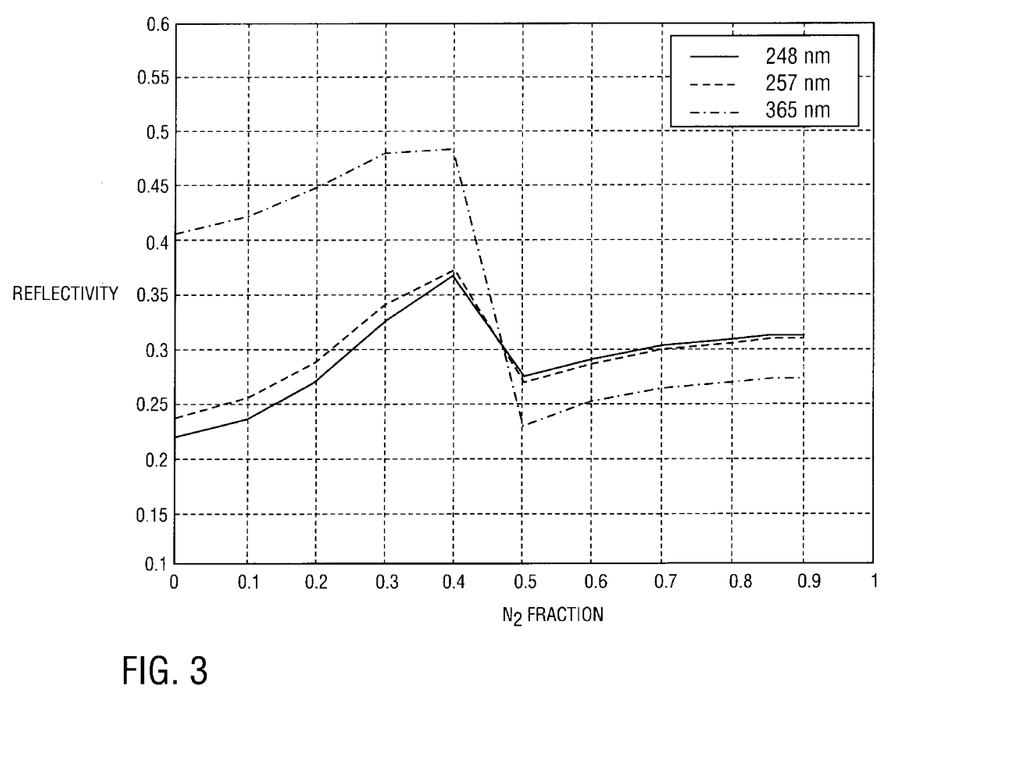
FIG. 3 shows an example of the dependence of reflectivity of a sputtered target of Ti as a function of $N_2$ content.

Both Ti and TiN have been found to exhibit absorbing and substantially non-reflective properties within the DUV spectrum. Deposition processing runs have indicated that low deposition power within the deposition chamber form substantially non-reflective Ti or TiN films (i.e. films with reflectivity at or under 35%). FIG. 3 shows the reflectivity at the indicated wavelengths that were observed as $N_2$ content was varied as a percentage against Ar content (i.e., Ar content+$N_2$ content=100%). Generally, $N_2$ fractions below 0.50 correspond to Ti and $N_2$ fractions above 0.50 correspond to TiN. The TiN films of FIG. 3 exhibit a reflectivity of 28–32% in the DUV spectrum. Note that in the process exercise of FIG. 3, TiN reflectivity was minimal at a Ar:$N_2$ ratio of 1:1.

The exercise of FIG. 3 was performed with a Ti target, 4 mTorr of total Ar and $N_2$ gas pressure at 6.5 kW of power. Even better reflectivity (e.g., 23–28% for TiN) was obtained when the power was reduced to 3.0 kW which indicates that a low power (i.e., below 6.5 kW) deposition can form films that are acceptably absorptive and substantially non-reflective within the DUV spectrum. A 23% reflectivity corresponds to a contrast of 0.505 for a multilayer structure 202 that is 70% reflective in the DUV spectrum. Note that other experimental data and the above described published references also indicate that NiSi, Cr and Zr possess optical properties suitable for forming EUV mask absorber layers with substantially low reflectivity within the DUV spectrum.

Along with using materials such as Ti, TiN, NiSi, Cr or Zr that intrinsically absorb but do not substantially reflect light within the DUV spectrum, additional processing steps may be undertaken to even further improve (i.e., reduce) their reflectivity within the DUV spectrum. For example, the surface of the absorber layer 204 may be roughened in order to "scatter" reflected DUV light (from the absorber layer 204) away from the collection lens of the inspection tool.

Figure 4A:
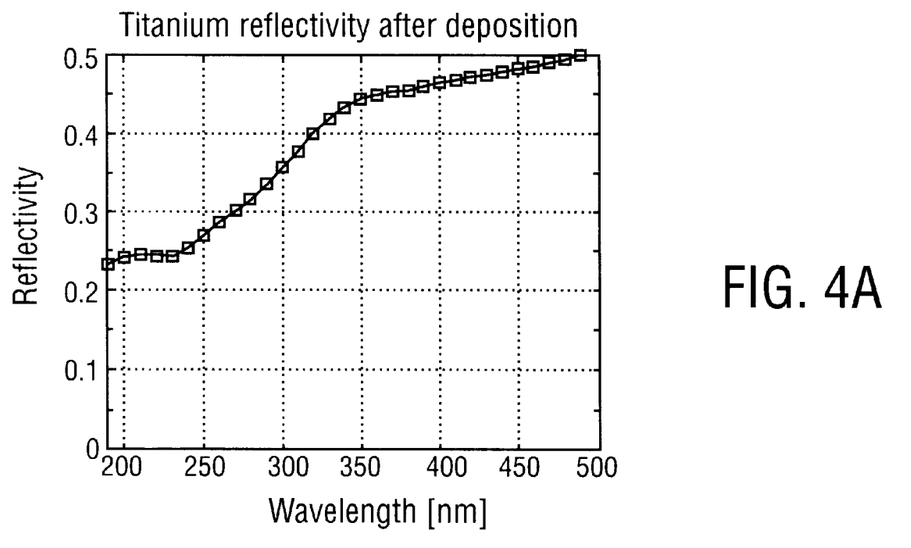
FIG. 4a shows the dependence of the reflectivity of "as deposited" EUV absorber structures, as a function of wavelength.

The surface roughening step may be applied at any suitable instance in the mask manufacturing sequence such as before buffer layer 203 removal, during buffer layer 203 removal or after buffer layer 203 removal. FIG. 4a shows a typical example of the reflectivity observed for Ti absorber layers 204 as deposited (i.e., not exposed to surface roughening (also referred to as "treatment")) and serves as a benchmark for comparison with treated absorber layers.

Figure 4B:
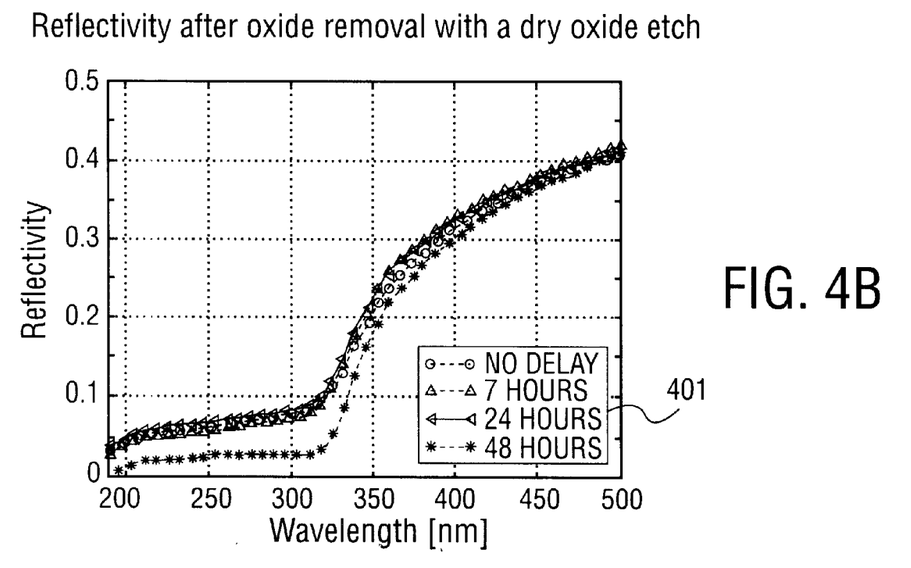
FIG. 4b shows the dependence of the reflectivity of EUV absorber structures, as a function of wavelength, after a dry buffer layer etch.
Figure 4C:
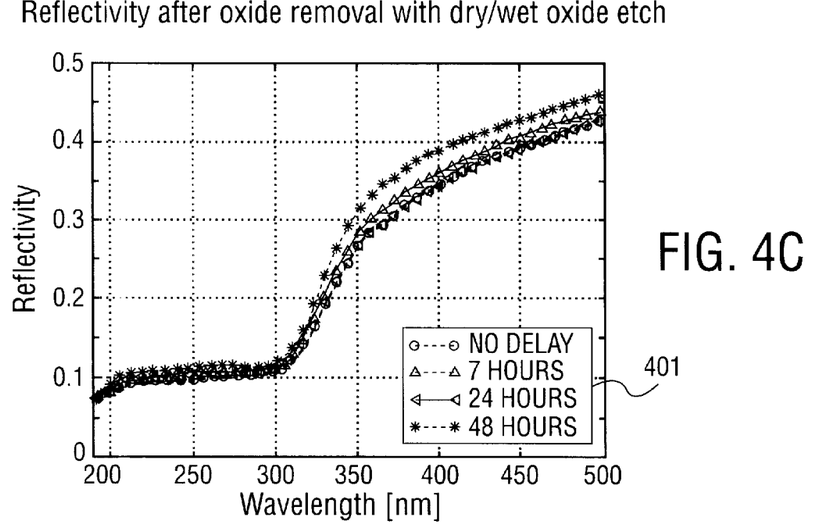
FIG. 4c shows the dependence of the reflectivity of EUV absorber structures, as a function of wavelength, after a dry buffer layer etch followed by a wet buffer layer etch.

FIGS. 4b and 4c show that absorber layers 204 having reflective properties as shown in FIG. 4a may demonstrate reduced reflectivity if exposed to surface treatments such as those described below. Note the indicated delay periods 401 correspond to the delay between the absorber layer etch and resist strip during the absorber layer 204 etch sequence. In the processes used to generate the data of FIGS. 4b and 4c, the absorber layer 204 surface was roughened simultaneously with the etch of the buffer layer 203. In FIG. 4b, a completely dry buffer layer etch was used; while in FIG. 4c, a partial oxide removal using a dry buffer layer etch followed by a wet buffer layer etch was used.

In FIG. 4b, as mentioned above, the buffer layer 203 was removed entirely with a dry etch. The dry etch was performed at 40 mTorr, with a 100 sccm flow of $CHF_3$ and 10 sccm flow of $O_2$. Note that reflectivities at or below 2.5% in the DUV spectrum have been obtained. This corresponds to contrasts at or greater than 0.931 for multilayer structures 202 having a reflectivity of 70% in the DUV spectrum.

In FIG. 4c, the buffer layer 203 was partially removed (approximately 75% of its original thickness) with a dry etch before being removed with a wet etch. The dry etch was performed with the same process parameters as described above (but for a shorter time period). The wet etch was performed by an etch in a dilute solution of hydrogen fluoride in ethylene glycol. Observed surface roughness was between 9.0 and 13.0 Å.

Referring back to FIG. 2, recall that the structure shown in FIG. 2f should exhibit suitable contrast for DUV light while the structure shown in FIG. 2g should exhibit suitable contrast for EUV and DUV light. Various approaches may be undertaken to create a reflective mask that operates not only within the EUV spectrum but also the DUV spectrum. In one approach, just described, the material(s) used to form the absorber layer 204 inherently absorb but do not substantially reflect (i.e., have a reflectivity at or below 35%) light in both spectra.

In another approach, however, an anti-reflective coating (ARC) that cancels reflected light within the DUV spectrum is formed as part of the absorber layer 204 structure. Such structures may be referred to as ARC absorber embodiments. As is known in the art, ARC layers are typically formed according to $\lambda/4n_i$ where $\lambda$ is the inspection tool's wavelength and $n_i$ is the refractive index of the ARC coating.

This causes light reflected at the air/ARC interface to cancel light reflected at the ARC/underlayer interface. However, it is important to note that the actual thickness of the ARC layer may vary if the ARC material demonstrates absorptive properties. That is, ARC layers are designed to produce reflected waves (180 degrees out of phase) having equal amplitudes. The amplitude of the reflected waves is a function of the absorptive nature of the ARC material which ultimately will affect the proper thickness to be used. Those of ordinary skill can adjust the thickness of their ARC layers accordingly.

In some ARC absorber embodiments, the absorber layer 204 is a TiN/Ti structure where the TiN acts as the ARC layer and is applied to the surface of the underlying Ti. In one embodiment (for a 257 nm inspection wavelength), the TiN is 8.0 nm and the Ti layer is 15.0 nm, although those of ordinary skill can readily determine a proper ARC and underlayer thickness for a given mask and inspection wavelength. In other 257 nm ARC absorber embodiments, a TiN/Al multilayer structure may be formed such as a 14.0 nm TiN ARC applied to an underlying 60.0 nm Al layer. In yet another other embodiments, $CrO_x/Cr$ structures may be formed.

In yet another ARC absorber embodiment, an oxide layer is allowed to form on top of the absorber layer 204. Ti absorber layers 204 have been found to oxidize. Cr also oxidizes. These oxide layers may be used as an ARC if the thickness of the oxide is proper. Furthermore, it has also been observed that the amount of time the resist layer 206 remains on the absorber layer 204, after the absorber layer etch (FIG. 2e) and before the resist layer 206 is removed (FIG. 2f) affects the thickness of the oxide formed on the absorber layer.

Figure 4D:
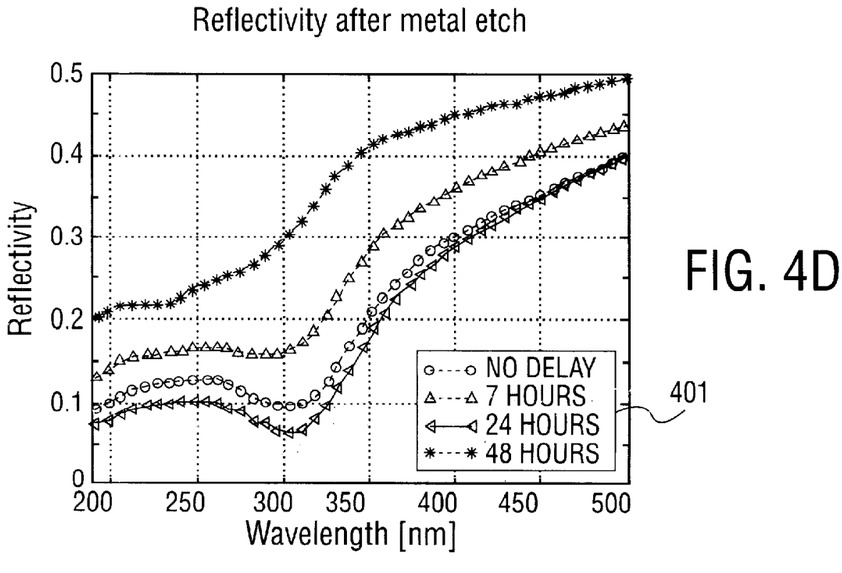
FIG. 4d shows the dependence of the reflectivity of EUV absorber structures, as a function of wavelength and as a function of the delay between the absorber layer etch and the resist strip during the absorber layer etch sequence.

That is, the amount of time that elapses between the steps shown in FIG. 2e and 2f affect the thickness of the oxide found on the absorber layer 204. FIG. 4d shows the variation in reflectivity for the Ti absorbers of FIGS. 4b and 4c before the aforementioned surface roughening treatments were performed. Delay periods 401 correspond to the delay between the absorber layer etch and resist strip during the absorber layer etch sequence. Note that in this example, a delay of 24 hours was optimal. Also note that, referring back to FIGS. 4b and 4c, the oxide layer was destroyed by the surface roughening treatment which accounts for the lack of sample variance as a function of resist removal delay time.

In order to further enhance the mask's contrast during mask inspection after resist removal (FIG. 2f), for any approaches described above, the buffer layer 203 thickness may be tailored to create constructive interference above the multilayer structure 202. That is, contrast is improved as the multilayer structure 202 becomes more reflective with tailored buffer layer 203 over multilayer structure 202. Here, in order to create constructive interference, the buffer layer thickness should correspond to approximately $\lambda/2n_i$, where $\lambda$ is the inspection tool's wavelength and $n_i$ is the refractive index of the buffer layer 203. However, similar to the discussion above relating to the ARC layer; the exact proper thickness is a function of the absorptive nature of the buffer layer 203. Again, those of ordinary skill will be able to tailor their buffer layer 203 thickness accordingly. Alternatively, a material reflective of light at the inspection wavelength may be used for buffer layer 203. For example, Aluminum has greater than 90% reflectivity in the DUV spectrum.

So far, the above discussion has been directed to masks having absorber 204 layers that are absorptive within the EUV and DUV spectrum and multilayer structures 202 that are reflective within the EUV and DUV spectrum. However, in yet another mask approach, the absorber material 204 may be designed to absorb light within the EUV spectrum and reflect light in the DUV spectrum. In this same approach, the buffer layer 203 my be tailored to act as an ARC layer (in the DUV spectrum) over the multilayer structure 209 such that, referring to FIG. 2f, high contrast is obtained in reverse polarity.

That is, the absorber layer 204 reflects defect inspection tool DUV light and absorbs EUV exposure light while the buffer layer 203 does not appreciably reflect the inspection tool DUV light. Approaches such as this may be used with more traditional absorber materials, such as Al, that exhibit high reflectivity of DUV light.

What is claimed is:

1. A method, comprising:
   a) forming a multilayer structure;
   b) forming a buffer layer over said multilayer structure;
   c) forming an absorber layer over said buffer layer; and
   d) roughening the surface of said absorber layer.

2. The method of claim 1 further comprising roughening the surface of said absorber layer with a plasma.

3. The method of claim 2 wherein said plasma is also used for an etch.

4. The method of claim 3 wherein said etch is an etch of said buffer layer.

5. The method of claim 1 further comprising forming said buffer layer to a thickness such that said buffer layer causes constructive interference of inspection tool light reflected at said buffer layer.

6. The method of claim 5 wherein said thickness is one half the wavelength of said inspection tool light within the buffer layer material.

7. The method of claim 1 wherein said buffer layer comprises a material substantially reflective of inspection tool light.

8. A method, comprising:
   a) forming a multilayer structure;
   b) forming a buffer layer over said multilayer structure;
   c) forming a first absorber layer over said buffer layer; and
   d) forming a second absorber layer over said first absorber layer, said second absorber layer an ARC layer tailored to cancel reflection at an inspection wavelength.

9. The method of claim 8 further comprising forming said buffer layer to a thickness such that said buffer layer causes constructive interference of inspection tool light reflected at said buffer layer.

10. The method of claim 9 wherein said thickness is one half the wavelength of said inspection tool light within the buffer layer material.

11. The method of claim 8 wherein said forming said second layer is accomplished by delaying the removal of photoresist upon said absorber layer.

12. The method of claim 8 wherein said buffer layer is substantially reflective of inspection tool light.

13. A method, comprising:
   a) forming a multilayer structure;
   b) forming a buffer layer over said multilayer structure; and
   c) depositing an absorber layer material over said buffer layer with a plasma power at or below 6.5 kW.

14. The method of claim 13 wherein said absorber layer material comprises Ti.

15. The method of claim 13 wherein said absorber layer material comprises TiN.

16. The method of claim 13 further comprising forming said buffer layer to a thickness such that said buffer layer causes constructive interference of inspection tool light reflected at said buffer layer.

17. The method of claim 13 further comprising forming said buffer layer to a thickness such that said buffer layer causes destructive interference of inspection tool light reflected at said buffer layer.

18. The method of claim 13 wherein said buffer layer is substantially reflective of inspection tool light.

19. An apparatus, comprising;
   a partially manufactured mask having a patterned absorber layer over a buffer layer, said buffer layer covering a multilayer structure, said multilayer structure tailored to reflect light at a semiconductor processing wavelength said partially manufactured mask having an associated contrast greater than 0.210 at an inspection wavelength.

20. The apparatus of claim 19 wherein said patterned absorber layer corresponds to non-reflective regions at said inspection wavelength and exposed regions of said buffer layer correspond to reflective regions at said inspection wavelength.

21. The apparatus of claim 20 wherein said buffer layer has a thickness tailored to produce constructive interference of light at said inspection wavelength reflected at said buffer layer.

22. The apparatus of claim 19 wherein said patterned absorber layer corresponds to reflective regions at said inspection wavelength and exposed regions of said buffer layer correspond to non-reflective regions at said inspection wavelength.

23. The apparatus of claim 22 wherein said buffer layer has a thickness tailored to produce destructive interference of light at said inspection wavelength reflected at said buffer.

24. A method of making a reflective mask, comprising;
   a) forming a multilayer structure;
   b) forming a buffer layer over said multilayer structure;
   c) forming an absorber layer over said buffer layer;
   d) patterning and removing portions of said absorber layer;
   e) inspecting said reflective mask at a first wavelength;
   f) correcting defects in said patterning discovered during said inspection; and
   g) removing exposed portions of said buffer layer such that said multilayer structure is exposed, said multilayer structure tailored to be reflective of semiconductor processing light at a second wavelength.

25. The method of claim 24 further comprising, prior to said inspecting, tailoring the thickness of said exposed portions of said buffer layer to produce constructive interference of reflected light at said first wavelength.

26. The method of claim 24 further comprising, prior to said inspecting, tailoring the thickness of said exposed portions of said buffer layer to produce destructive interference of reflected light at said first wavelength.

27. The method of claim 24 further comprising a second inspecting of said reflective mask at said first wavelength after said multilayer structure is exposed.

28. The method of claim 27 further comprising a second correcting of defects discovered during said second inspection.

* * * * *